United States Patent
Chou et al.

(10) Patent No.: US 9,606,198 B2
(45) Date of Patent: Mar. 28, 2017

(54) MAGNETIC FIELD PROBE, MAGNETIC FIELD MEASUREMENT SYSTEM AND MAGNETIC FIELD MEASUREMENT METHOD

(71) Applicant: NATIONAL TAIWAN UNIVERSITY, Taipei (TW)

(72) Inventors: Yien-Tien Chou, Taipei (TW); Hsin-Chia Lu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 354 days.

(21) Appl. No.: 14/273,558

(22) Filed: May 9, 2014

(65) Prior Publication Data
US 2015/0160309 A1 Jun. 11, 2015

(30) Foreign Application Priority Data
Dec. 9, 2013 (TW) .............................. 102145152 A

(51) Int. Cl.
*G01R 33/02* (2006.01)
*G01V 3/08* (2006.01)
(Continued)

(52) U.S. Cl.
CPC ......... *G01R 33/10* (2013.01); *G01R 33/0047* (2013.01); *G01R 33/0052* (2013.01); *G01R 31/315* (2013.01)

(58) Field of Classification Search
CPC ...................................................... G01R 33/10
(Continued)

(56) References Cited

U.S. PATENT DOCUMENTS 6,163,150 A 12/2000 Tamaki et al.
6,184,693 B1 2/2001 Arai et al.
(Continued)

FOREIGN PATENT DOCUMENTS

EP 0239251 A2 9/1987
JP 2009169966 A 7/2009
(Continued)

OTHER PUBLICATIONS

Whiteside et al., "The Loop Antenna as a Probe," IEEE Transacions on Antennas and Propagation, vol. AP-12, p. 291-297, May 1964.
(Continued)

*Primary Examiner* — Bot Ledynh
(74) *Attorney, Agent, or Firm* — CKC & Partners Co., Ltd.

(57) ABSTRACT

A magnetic field probe, a magnetic field measurement system, and a magnetic field measurement method are provided. The magnetic field probe includes a probe head. The probe head includes a first and second inner metal layer. The first inner metal layer includes a first sensing part and a first connecting part coupled thereto. The first sensing part is configured for detecting a magnetic field signal of a device under test to form a first magnetic field distribution signal. The second inner metal layer includes a second sensing part and a second connecting part coupled thereto. The second sensing part is configured for detecting the magnetic field signal of the device under test to form a second magnetic field distribution signal. A distance between the first sensing part and the device under test is smaller than that between the second sensing part and the device under test.

18 Claims, 12 Drawing Sheets

(51) Int. Cl.
- *G01V 3/10* (2006.01)
- *G01R 31/20* (2006.01)
- *G01R 33/10* (2006.01)
- *G01R 33/00* (2006.01)
- *G01R 31/315* (2006.01)

(58) Field of Classification Search
USPC .................................................. 324/258, 329
See application file for complete search history.

(56) References Cited

U.S. PATENT DOCUMENTS

| | | | |
|---|---|---|---|
| 6,320,376 | B1 | 11/2001 | Tamaki et al. |
| 6,704,670 | B2 | 3/2004 | McTigue |
| 6,734,689 | B1 | 5/2004 | Yang |
| 6,750,648 | B1 | 6/2004 | Tamaki et al. |
| 6,856,131 | B2 | 2/2005 | Miyazawa et al. |
| 7,362,098 | B2 | 4/2008 | Ando et al. |
| 7,595,650 | B2 | 9/2009 | Funato et al. |
| 2008/0055080 | A1* | 3/2008 | Britton .......................... 340/551 |

FOREIGN PATENT DOCUMENTS

| | | |
|---|---|---|
| TW | 577994 B | 3/2004 |
| TW | I328684 B | 8/2010 |
| TW | M401773 U1 | 4/2011 |
| WO | 2005/076039 A1 | 8/2005 |

OTHER PUBLICATIONS

John D. Dyson, "Measurement of Near Fields of Antennas and Scatterers," IEEE Transactions on Antennas and Propagation, vol. AP-21, No. 4, p. 446-460, Jul. 1973.

Motohisa Kanda, "Standard Probes for Electromagnetic Field Measurements," IEEE Transactions on Antennas and Propagation, vol. 41, No. 10, p. 1349-1364, Oct. 1993.

Tamaki et al., "A Miniature Thin-Film Shielded-Loop Probe with a Flip-Chip Bonding for Magnetic Near Field Measurements," IEICE Tran. Electonics, vol. J87-C, No. 3, p. 335-342, Mar. 2004.

Ando et al., "Miniaturized Thin-film Magnetic Field Probe with High Spatial Resolution for LSI Chip Measurement," in Proc. IEEE Int. Electromagn. Compat. Symp., Aug. 2004, p. 357-362.

Funato et al., "Magnetic Near-field Probe for GHz band and Spatial Resolution Improvement Technique," in IEEE Int. Zurich Symp. on EMC, Mar. 2006, p. 284-287.

CEI IEC 61967-6: "Integrated circuits—Measurement of electromagnetic emissions, 150 kHz to 1 GHz—Part 6: Measurement of conducted emissions—magnetic probe method," Jun. 2002.

Lin et al., "Printed Magnetic Field Probe with Enhanced Performances," IEEE 2009.

Chou et al., "Space Difference Magnetic Near-Field Probe With Spatial Resolution Improvement," IEEE Transactions on Microwave Theory and Techniques, vol. 61, No. 12, Dec. 2013, p. 4233-4244.

* cited by examiner

MAGNETIC FIELD PROBE, MAGNETIC FIELD MEASUREMENT SYSTEM AND MAGNETIC FIELD MEASUREMENT METHOD

RELATED APPLICATIONS

This application claims priority to Taiwanese Application Serial Number 102145152, filed Dec. 9, 2013, which is herein incorporated by reference.

BACKGROUND

Field of Invention

The present invention relates to a magnetic field probe. More particularly, the present invention relates to a difference magnetic field probe.

Description of Related Art

Recently, the sizes of electronic products have become smaller and smaller, and performance requirements for radio transmission and high speed circuits have become higher and higher. As a result, the circuits required are more and more complex so that the difficulty in circuit integration has been increasing. One of the reasons is that the radio frequency devices disposed in the circuits cause signal integrity (SI) problem, electromagnetic interference (EMI) problem, etc. Such problems increase the difficulties in circuit design and debugging. During a debugging process, a magnetic field probe is usually utilized to scan and detect a magnetic field distribution nearby an electronic product so as to rapidly detect an electromagnetic interference source.

Due to the small sizes of the devices under test and the increased sources of interference, market demand for magnetic field probes having a high spatial resolution and a wide operating bandwidth (related to electric field isolation and resonance frequency) has been increasing. However, the smaller the distance between a magnetic field probe and a device under test is, the more obvious the interference caused by electric field noises is. Accordingly, the result of magnetic field detection is impacted. A traditional magnetic field probe usually improves the spatial resolution by shrinking the loop size, but the reduced loop size means lower magnetic loop probe sensitivity. Although increasing the loop size can reduce the interference caused by electric field noises, the spatial resolution is reduced, too. Moreover, the resonance frequency tends to occur at low detection frequencies. As a result, the probe fails to detect the correct magnetic field distribution at the resonance frequency.

SUMMARY

An aspect of the present invention is related to a magnetic field probe. The magnetic field probe includes a probe head. The probe head includes a first inner metal layer and a second inner metal layer. The first inner metal layer includes a first sensing part and a first connection part coupled to the first sensing part. The first sensing part is configured for detecting a magnetic field signal of a device under test so as to form a first magnetic field distribution. The second inner metal layer includes a second sensing part and a second connection part coupled to the second sensing part. The second sensing part is configured for detecting the magnetic field signal of the device under test so as to form a second magnetic field distribution. A distance between the first sensing part and the device under test is smaller than a distance between the second sensing part and the device under test.

Another aspect of the present invention is related to a magnetic field measurement system. The magnetic field measurement system includes a magnetic field probe and a measurement module. The magnetic field probe includes a first sensing part and a second sensing part configured for detecting a magnetic field signal of a device under test. A first vertical distance between the first sensing part and the device under test is smaller than a second vertical distance between the second sensing part and the device under test. The measurement module is configured for obtaining a difference magnetic field distribution according to the magnetic field signal of the device under test detected by the first sensing part and the second sensing part.

A further aspect of the present invention is related to a magnetic filed measurement method. The magnetic field measurement method includes: detecting a magnetic field signal of a device under test by a first sensing part and a second sensing part of a magnetic field probe, in which a first vertical distance between the first sensing part and the device under test is smaller than a second vertical distance between the second sensing part and the device under test; moving the magnetic field probe such that the magnetic field probe moves horizontally relative to the device under test; forming a difference magnetic field distribution according to a variation of the magnetic field signal of the device under test detected by the first sensing part and the second sensing part along a horizontal axis when the magnetic field probe moves horizontally.

In summary, the present invention magnetic field probe has a better spatial resolution. In addition, since it is not necessary to shrink the size of the loop gap, the present invention magnetic field probe maintains a good sensitivity. The present invention magnetic field probe also has good suppression ability for asymmetric coupled electric field, and the resolution of the present invention magnetic field probe is less sensitive to its distance to the device under test (that is, the resolution of the difference magnetic field probe is not susceptible to the influence of the surface roughness of the device under test).

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1A:
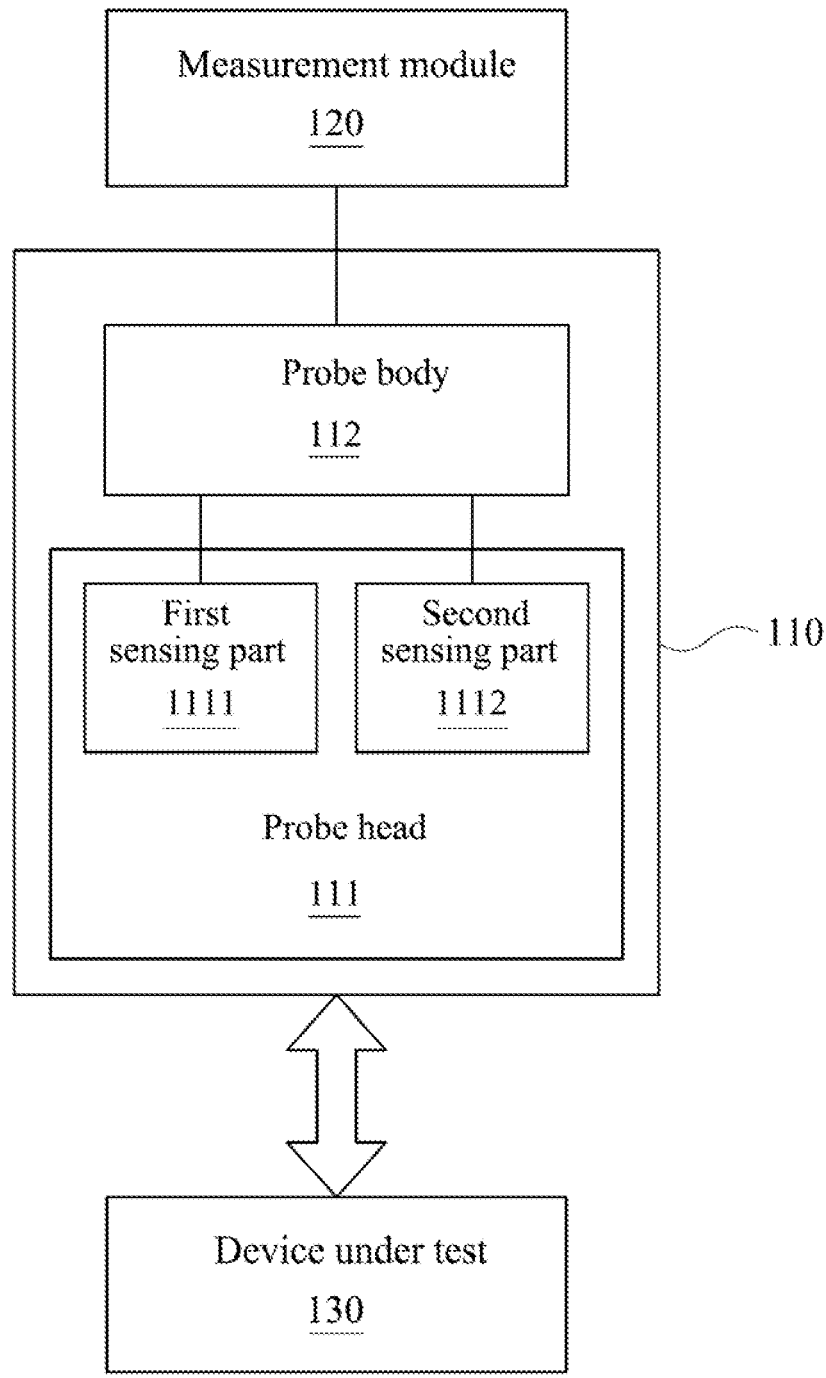
FIG. 1a is a block diagram illustrating a magnetic field measurement system according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1a. FIG. 1a is a block diagram illustrating a magnetic field measurement system 100 according to one embodiment of the present invention. As shown in FIG. 1a, the magnetic field measurement system 100 includes a magnetic field probe 110 and a measurement module 120. Generally, in order to detect spatial resolution and operable bandwidth of the magnetic field probe, a device under test is usually utilized to work together so as to detect the two foregoing parameters. Hence, according to the present embodiment, the magnetic field probe 110 cooperates with a device under test 130. The device under test 130 may be a microstrip line having an impedance of 50 ohms. The magnetic field probe 110 includes a probe head 111 and a probe body 112. The probe head 111 includes a first sensing part 1111 and a second sensing part 1112 configured for detecting a magnetic field signal of the device under test 130. The measurement module 120 is configured for obtaining a difference magnetic field distribution according to the magnetic field signal of the device under test 130 detected by the first sensing part 1111 and the second sensing part 1112.

Figure 1B:
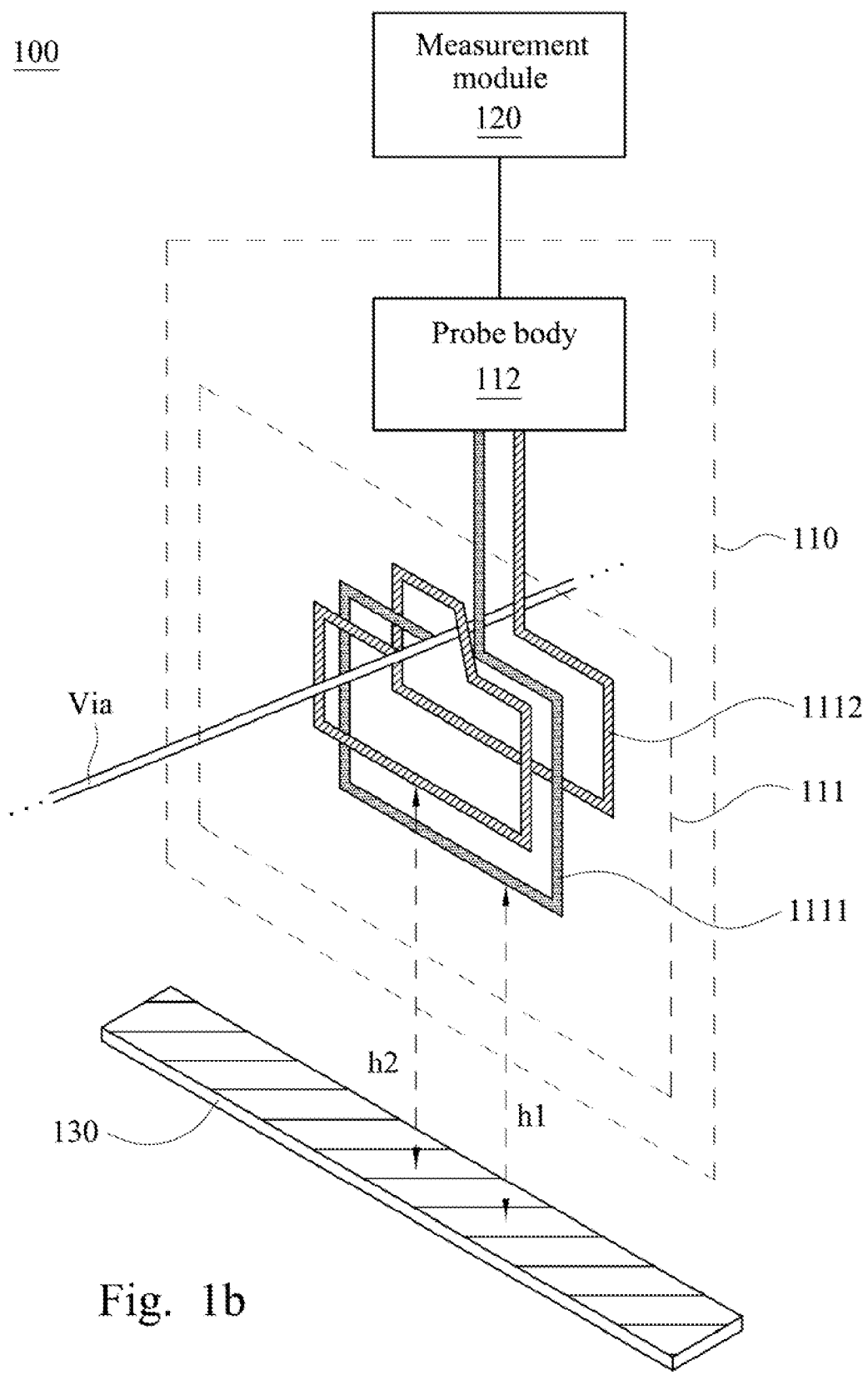
FIG. 1b is a schematic diagram illustrating a magnetic field measurement system according to one embodiment of the present invention.

Reference is made to FIG. 1a and FIG. 1b. FIG. 1b is a schematic diagram illustrating the magnetic field measurement system 100 according to one embodiment of the present invention. As shown in FIG. 1b, the first sensing part 1111 includes a single loop. The second sensing part 1112 includes dual loops. The single loop of the first sensing part 1111 is between the dual loops of the second sensing part 1112 to form a sandwich structure. In addition, the first sensing part 1111 and the second sensing part 1112 are coupled to a metal rod Via, and coupled to a ground terminal (not shown in the figure) through the metal rod Via.

It is noted that a first vertical distance h1 is between the single loop of the first sensing part 1111 and the device under test 130 (e.g. the microstrip line). A second vertical distance h2 is between the dual loops of the second sensing part 1112 and the device under test 130. The first vertical distance h1 is smaller than the second vertical distance h2.

According to electromagnetic principle, the magnetic field strength between two objects correlates with the distance between the two objects. In this manner, when a vertical distance between the magnetic field probe 110 and the device under test 130 is fixed, a strength variation of the magnetic field signal of the device under test 130 detected by the first sensing part 1111 is different from that detected by the second sensing part 1112. Hence, the first sensing part 1111 and the second sensing part 1112 of the magnetic field probe 110 have different spatial resolutions.

Additionally, according to electromagnetic principle, the shorter the distance between two objects is, the stronger the magnetic field strength thus formed is. In this manner, the strength of the magnetic field signal of the device under test 130 detected by the first sensing part 1111 is higher than the strength of the magnetic field signal of the device under test 130 detected by the second sensing part 1112. In other words, in the magnetic field probe 110, the spatial resolution of a first magnetic field distribution formed from the magnetic field signal detected by the first sensing part 1111 is better than the spatial resolution of a second magnetic field distribution formed from the magnetic field signal detected by the second sensing part 1112 since the magnetic field signal detected by the first sensing part 1111 is more sharply changed.

Figure 2A:
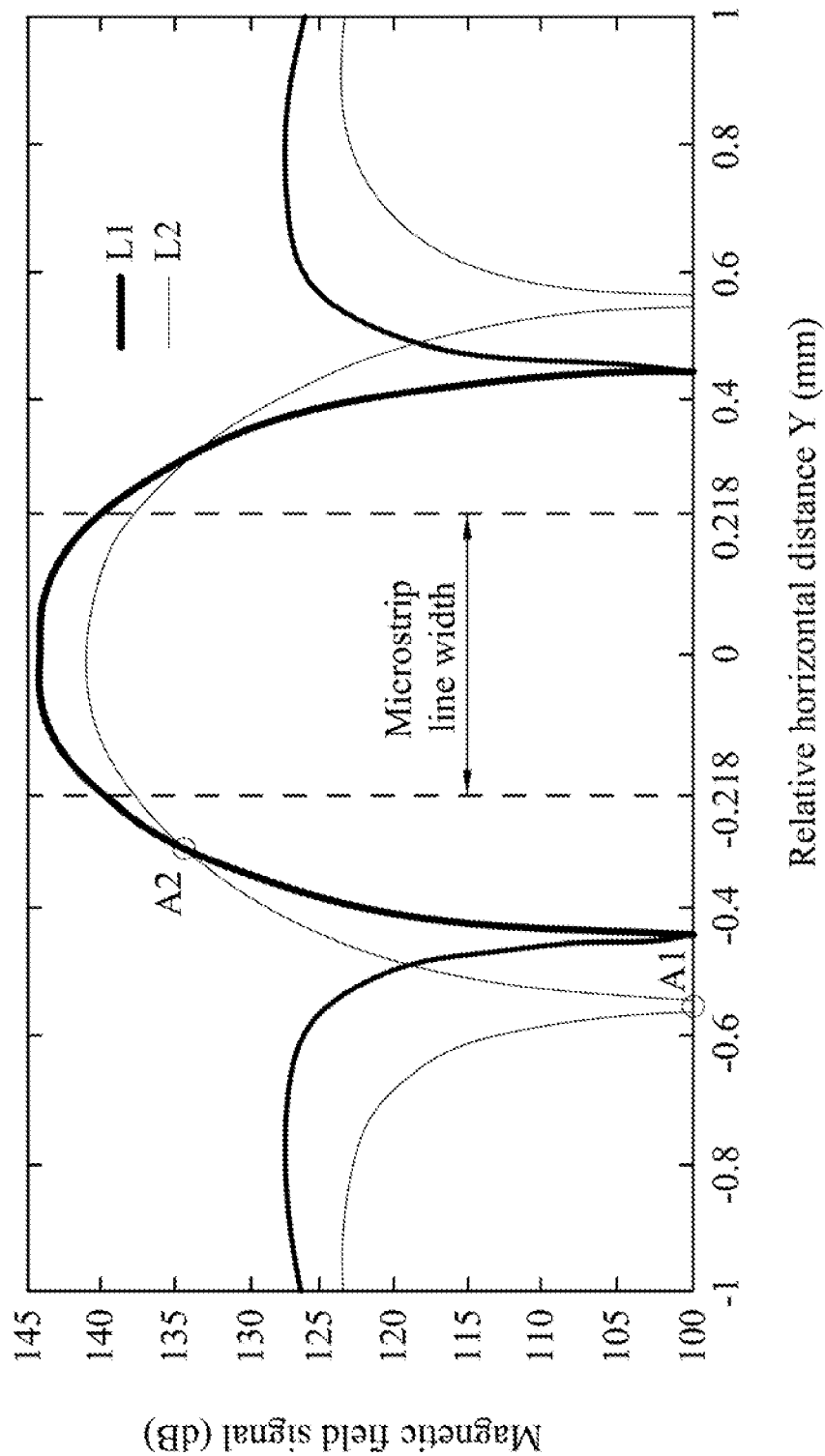
FIG. 2a illustrates a magnetic field distribution diagram according to one embodiment of the present invention.

To simplify and clarify matters, a description is provided with reference to FIG. 1b and FIG. 2a. FIG. 2a illustrates a magnetic field distribution diagram according to one embodiment of the present invention. The horizontal axis represents a relative horizontal distance Y between the magnetic field probe 110 and the device under test 130 (positive and negative only indicate directions), and the vertical axis represents the strength of the magnetic field signal of the device under test 130 detected by the magnetic field probe 110. According to one operation of the present embodiment, the first sensing part 1111 and the second sensing part 1112 of the magnetic field probe 110 are configured for detecting the magnetic field signal of the device under test 130 (such as the microstrip line).

Since the strength of the magnetic field signal detected by the first sensing part 1111 and the second sensing part 1112 correlates with the distance between the magnetic field probe 110 and the microstrip line, the smaller the distance is the stronger the magnetic field thus detected is. As a result, as shown in FIG. 2a, when the magnetic field probe 110 is located at a center point of the microstrip line (that is the relative horizontal distance Y is zero), the first sensing part 1111 and the second sensing part 1112 can detect the strongest magnetic field signal if the line width is relatively narrow or the distance between the probe and the detected line is not small enough. The strength of the detected magnetic field signal decreases with the increased relative horizontal distance between the magnetic field probe 110 and the microstrip line. In addition, the magnetic field signal detected by the first sensing part 1111 and the second sensing part 1112 respectively form the first magnetic field distribution (such as curve L1 in FIG. 2a) and the second magnetic field distribution (such as curve L2 in FIG. 2a) versus the relative horizontal distance by the measurement module.

In the present embodiment, the spatial resolution is defined as the relative horizontal distance between the point with the maximum magnetic field signal strength (usually occurs at the center point of the microstrip line) and the point with the magnetic field signal strength detected by the magnetic field probe 110, which is 6 dB less than the maximum magnetic field signal strength. The steeper the magnetic field distribution is, the better the spatial resolution of the magnetic field probe 110 is.

Since the first vertical distance h1 between the first sensing part 1111 and the device under test 130 is smaller than the second vertical distance h2 between the second sensing part 1112 and the device under test 130, the strength of the magnetic field signal detected by the first sensing part 1111 is higher than the strength of the magnetic field signal detected by the second sensing part 1112 when a distance between the magnetic field probe 110 and the device under test 130 is fixed. In other ords, the spatial resolution of the more abruptly changed first magnetic field distribution formed by the first sensing part 1111 is superior to the spatial resolution of a second magnetic field distribution formed by the second sensing part 1112 (for example in FIG. 2a, curve L1 is steeper than curve L2).

Figure 2B:
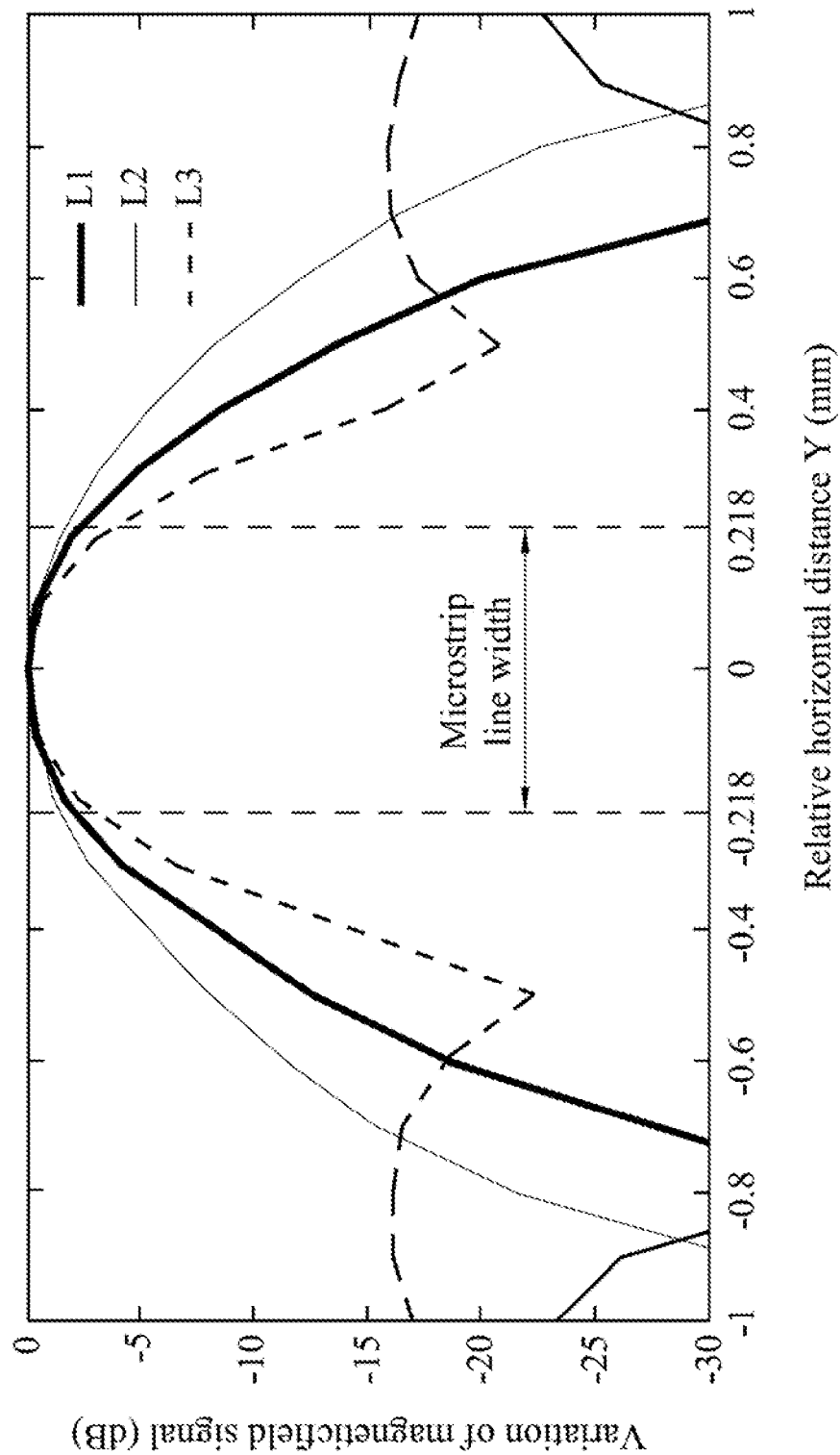
FIG. 2b illustrates a normalized magnetic field distribution diagram according to one embodiment of the present invention.

Additionally, in FIG. 2a, if the second magnetic field distribution is subtracted from the first magnetic field distribution (that is to subtract curve L2 from curve L1 ), the original zero position A1 in FIG. 2a will move to the position A2 (assumed that the phase change of the detected signal is very small). Furthermore, a curve obtained by subtracting curve L2 from curve L1 has a narrower distribution. FIG. 2b illustrates a normalized magnetic field distribution diagram according to one embodiment of the present invention. As shown in FIG. 2b, the horizontal axis represents the relative horizontal distance between the magnetic field probe 110 and the device under test 130 (positive and negative only indicate directions), and the vertical axis represents a variation of the magnetic field signal of the device under test 130 detected by the magnetic field probe 110.

Curve L1 and curve L2 are the first magnetic field distribution and the second magnetic field distribution in FIG. 2a, respectively. The difference lies in that tops of both curve L1 and curve L2 are located at a position where the variation is zero because the vertical axis represents the variation of the magnetic field signal. In addition to that, curve L3 represents the difference magnetic field distribution obtained by subtracting the second magnetic field distribution from the first magnetic field distribution, that is, the curve distribution obtained by subtracting curve L2 in FIG. 2a from curve L1 in FIG. 2a. As shown in FIG. 2b, curve L3 is steeper than curve L1 and curve L2 . In other words, a resolution of the difference magnetic field distribution is superior to a resolution of the first magnetic field distribution and a resolution of the second magnetic field distribution.

Therefore, in FIG. 1a and FIG. 1b, the measurement module 120 of the magnetic field measurement system 100 generates a first magnetic field sensing signal and a second magnetic field sensing signal respectively according to the magnetic field signal detected by the first sensing part 1111 and the magnetic field signal detected by the second sensing part 1112, and compares the first magnetic field sensing signal and the second magnetic field sensing signal to generate a differential magnetic field sensing signal. The different differential magnetic field sensing signals are obtained with the various relative horizontal distances between the magnetic field probe 110 and the device under test 130 so as to form the differential magnetic field distribution shown in FIG. 2b. In this manner, not only is the spatial resolution of the magnetic field probe 110 improved due to the differential magnetic field distribution obtained through the measurement module 120, but the sensitivity is also maintained well (because a size of a loop coil is not reduced with the increased resolution).

Figure 3A:
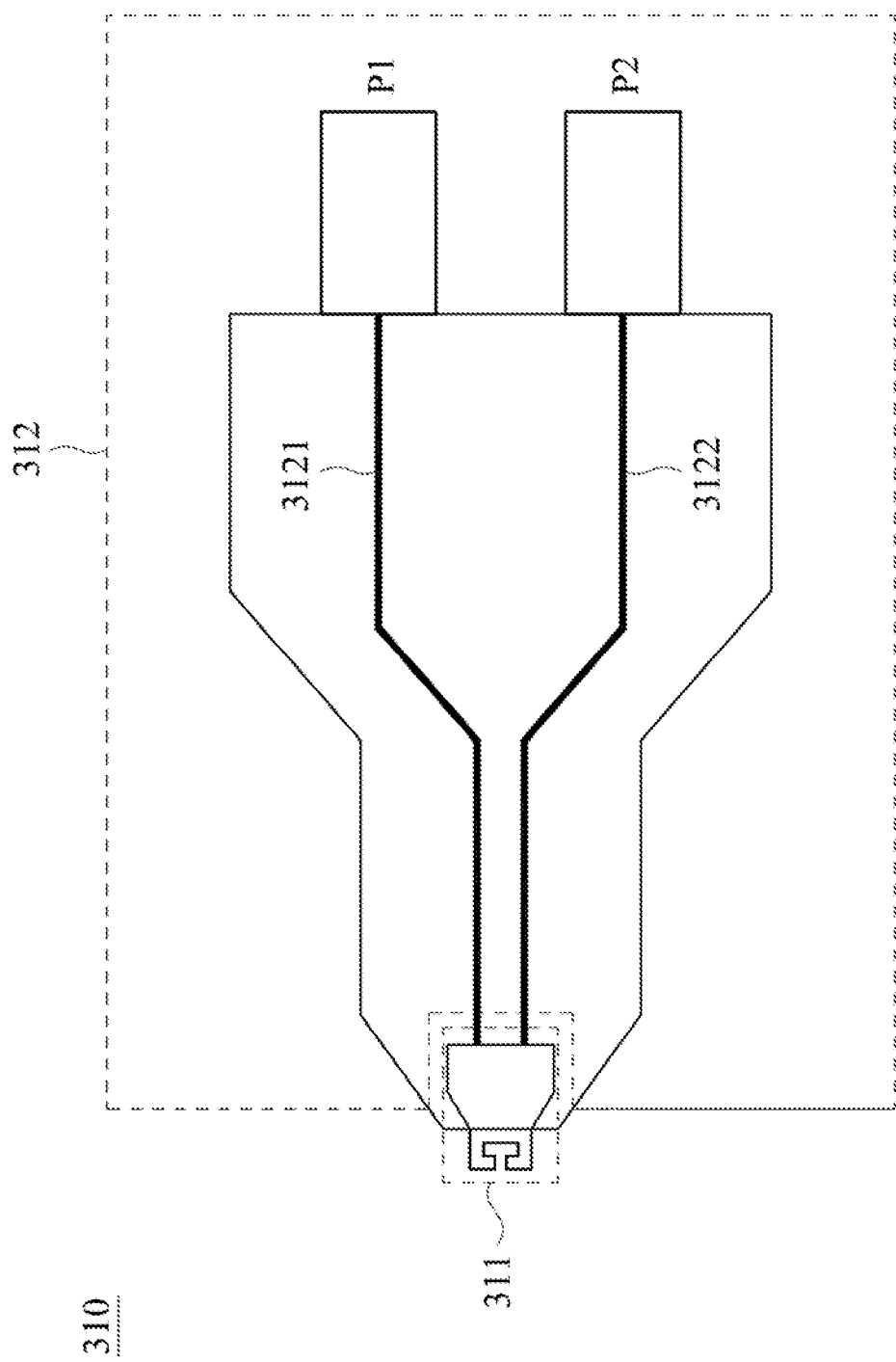
FIG. 3a is a schematic diagram illustrating a magnetic field probe according to one embodiment of the present invention.
Figure 3B:
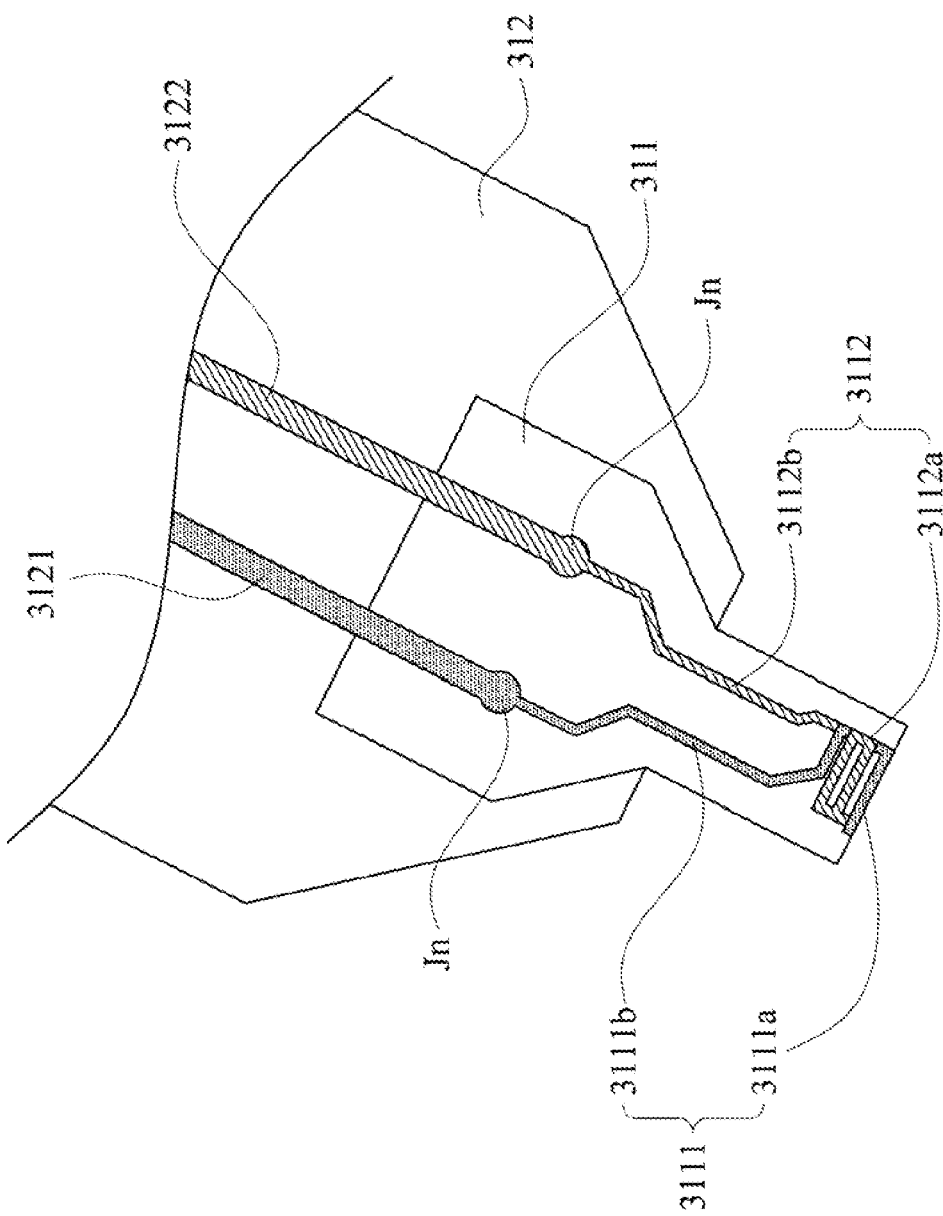
FIG. 3b is a schematic diagram illustrating a probe head according to one embodiment of the present invention.
Figure 3C:
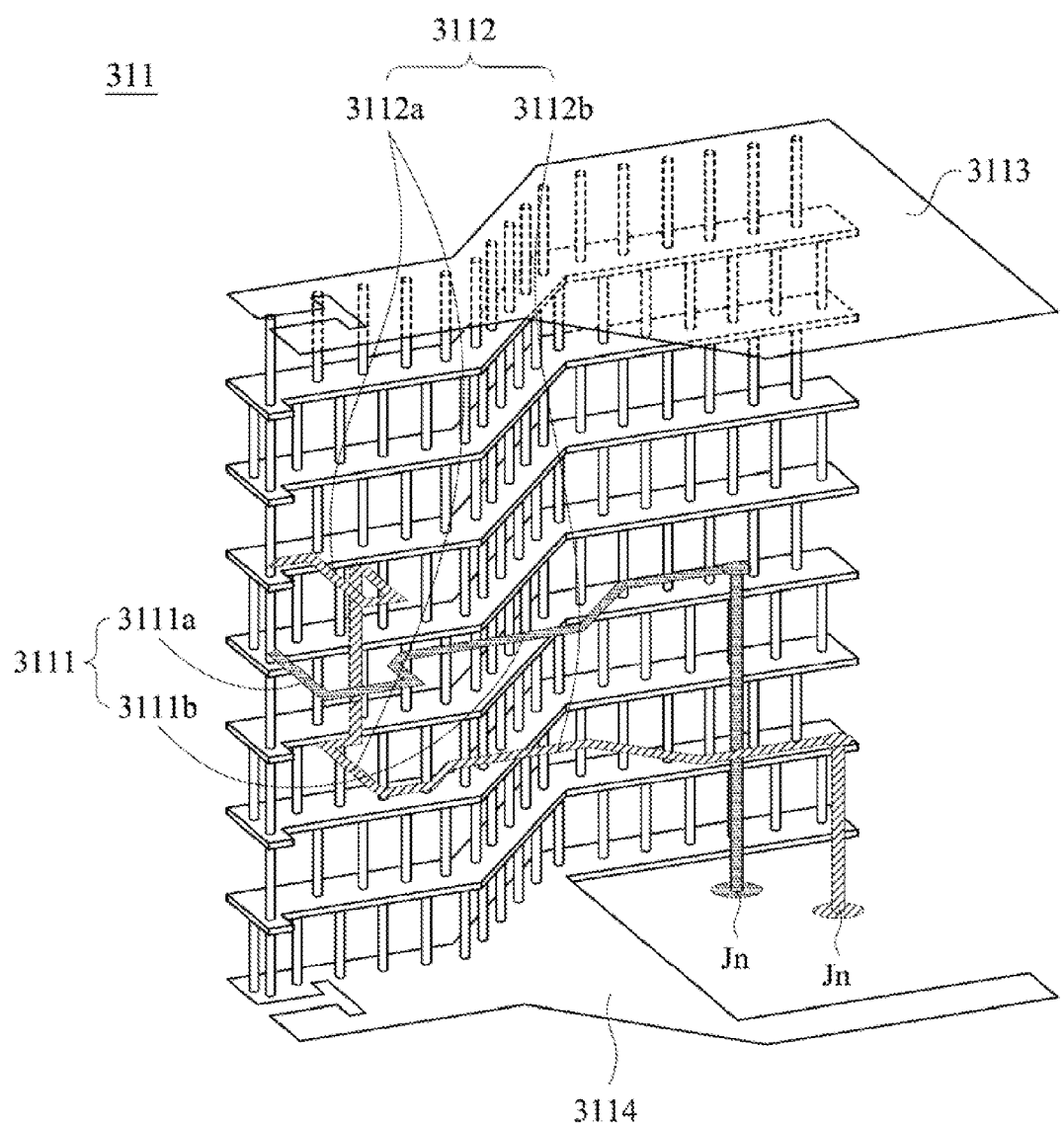
FIG. 3c is a layout diagram illustrating a probe head according to one embodiment of the present invention.

Reference is made to FIG. 3a, FIG. 3b and FIG. 3c. FIG. 3a is a schematic diagram illustrating a magnetic field probe 310 according to one embodiment of the present invention. FIG. 3b is a schematic diagram illustrating a probe head 311 according to one embodiment of the present invention. FIG. 3c is a layout diagram illustrating a probe head 311 according to one embodiment of the present invention. The magnetic field probe 310 shown in FIG. 3a and the probe head 311 shown in FIG. 3c may be applied to the magnetic field measurement system 100 shown in FIG. 1a and FIG. 1 b and other magnetic field measurement systems described in the following embodiments, but the present invention is not limited in this regard.

The magnetic field probe 310 includes a probe head 311 and a probe body 312. In greater detail, the probe head 311 comprises a first inner metal layer 3111 and a second inner metal layer 3112. The first inner metal layer 3111 includes a first sensing part 3111a and a first connection part 3111b. The second inner metal layer 3112 includes a second sensing part 3112a and a second connection part 3112b. The probe body 312 includes a first stripline 3121 and a second stripline 3122. The first connection part 3111b and the second connection part 3112b are respectively coupled to the first stripline 3121 and the second stripline 3122 through strip adapters Jn. The first stripline 3121 and the second stripline 3122 are respectively coupled to a first output port P1 and a second output port P2 . The first stripline 3121 and the second stripline 3122 are respectively configured for outputting a magnetic field signal of a device under test (not shown in the figures) detected by the first sensing part 3111a to the first output port. P1 and the magnetic field signal of the device under test detected by the second sensing part 3112a to the second output port P2 , and outputting the magnetic field signal to the measurement module 120 (not shown in the figures) via the first output port P1 and the second output port P2.

In one embodiment, the first inner metal layer 3111 and the second inner metal layer 3112 may be respectively coupled to the first stripline 3121 and the second stripline 3122 using flip-flop technology. However, the present embodiment is not limited in this regard.

According to the present embodiment, the magnetic field probe 310 may be fabricated by a low temperature co-fired ceramic (LTCC) process and formed in a stack manner, but the present embodiment is not limited in this regard. A circuit substrate of low temperature co-fired ceramics is made of a ceramic material and has a multilayer structure. In addition, electrical circuits are printed on the circuit substrate by a screen printing technique and tens of thousands of via holes are punched through each of the layers to allow signals to transmit vertically. Because a ceramic material is very close to a silicon material in their properties, it is very suitable to be connected with an IC chip, thus saving space and reducing cost.

As shown in FIG. 3c, the probe head 311 further includes a first shielding layer 3113 and a second shielding layer 3114. The first inner metal layer 3111 and the second inner metal layer 3112 are disposed between the first shielding layer 3113 and the second shielding layer 3114. The first sensing part 3111a and the second sensing part 3112a are coupled to a metal rod Via (not shown in the figure), and coupled to the first shielding layer 3113 and the second shielding layer 3114 through the metal rod Via. The first shielding layer 3113 and the second shielding layer 3114 are coupled to a ground terminal (not shown in the figure) and respectively used for shielding coupled electric fields between the device under test (not shown in the figure) and the first inner metal layer 111 and between the device under test and the second inner metal layer 3112.

Additionally, an opening is formed in each of the first shielding layer 3113 and the second shielding layer 3114. The openings are respectively located at positions where orthogonal projections of the first sensing part 3111a on the first shielding layer 3113 and the second sensing part 3112a on the second shielding layer 3114 are located.

In the present embodiment, the first sensing part 3111a of he first inner al layer 3111 has a single loop. The second sensing part 3112a of the second inner metal layer 3112 has dual loops. Since the magnetic field probe 310 is fabricated by a low temperature co-fired ceramic process, a gap between each of the two layers is too large (for example: 52 μm) to allow the first shielding layer 3113 and the second shielding layer 3114 to completely shield the electric field coupling between the device under test and the first inner metal layer 3111 and between the device under test an the second inner metal layer 3112. In addition, an area of a loop coil of the first sensing part 3111a is greater than an area of a loop coil of the second sensing part 3112a. Hence, in order to avoid the effect on the magnetic field signal detected by the first sensing part 3111a and the second sensing part 3112a that is caused by the coupled electric fields between the device under test and the first inner metal layer 3111 and between the device under test and the second inner metal layer 3112, the second sensing part 3112a has the dual loops and the single loop of first sensing part 3111a is disposed between the dual loops of the second sensing part 3112a. As a result, the coupled electric field between the device under test and the second inner metal layer 3112 is approximately the same as the coupled electric field between the device under test and the first inner metal layer 3111 so as to reduce the effect of the coupled electric fields on the detected magnetic field signal.

It is noted that if the magnetic field probe is fabricated by a process being able to make very thin layers, such as a thin-film process, the gap between each of the two layers of the magnetic field probe may has a width of merely 1 μm so that the coupled electric fields received by the magnetic field probe are very small. Under the circumstances, the second sensing part of the second inner metal layer in the magnetic field probe may only have a single loop. With such a configuration, the second inner metal layer having the single loop has a higher natural frequency of vibration. Furthermore, under the premise that no electric field coupling needs to be considered, the first inner metal layer and the second inner metal layer tend to have a higher resonance frequency which achieves a wider band. Besides, phase difference between the first and the second inner metal layers is easier adjusted to zero for wideband operation.

Figure 4A:
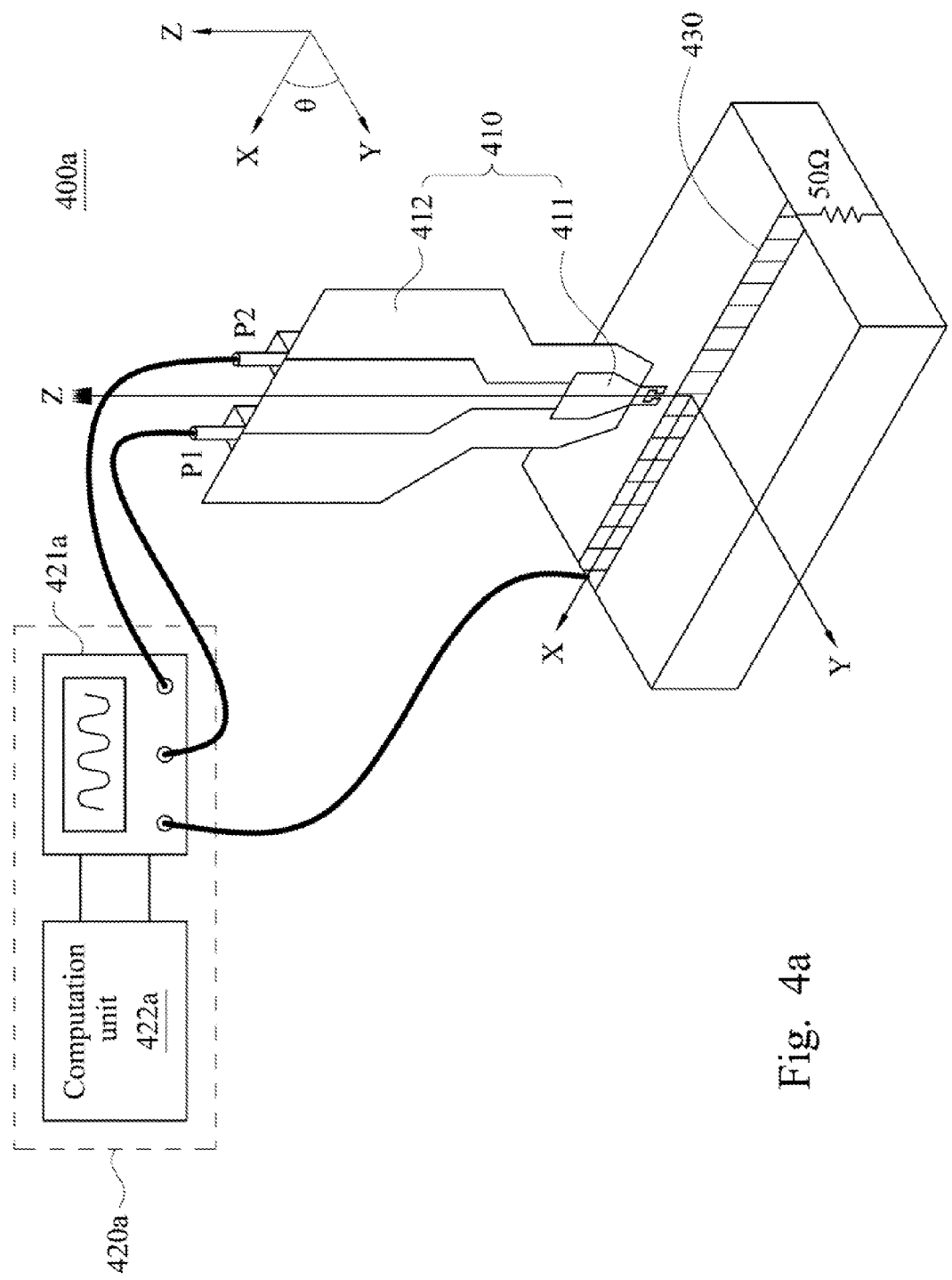
FIG. 4a is a schematic diagram illustrating a magnetic field measurement system according to another embodiment of the present invention.

Reference is made to FIG. 4a, FIG. 4a is a schematic diagram illustrating a magnetic field measurement system 400a according to another embodiment of the present invention. The magnetic field measurement system 400a includes a magnetic field probe 410, a measurement module 420a, and a device under test 430. The magnetic field probe 410 includes a probe head 411 and a probe body 412. According to the present embodiment, the magnetic field probe 410 may be the magnetic field probe 310 shown in FIG. 3a. The probe head 411 may be the probe head 311 shown in FIG. 3c. In other words, the probe head 411 also includes a first sensing part and a second sensing part (not shown in the figure) configured for detecting a magnetic field signal of the device under test 430, and the detected magnetic field signal is output to the measurement module 420a via the first output port P1 and the second output port P2.

It is noted that, in the present embodiment, the first sensing part has a single loop. The second sensing part has dual loops. The single loop of the first sensing part is disposed between the dual loops of the second sensing part. In addition, a first vertical distance between the first sensing part and the device under test 430 is smaller than a second vertical distance between the second sensing part and the device under test 430. That is, a strength of the magnetic field signal of the device under test 430 detected by the first sensing part is higher than a strength of the magnetic field signal of the device under test 430 detected by the second sensing part.

In one embodiment, the measurement module 420a includes a magnetic field analysis unit 421a and a computation unit 422a. The magnetic field analysis unit 421a generates a first magnetic field sensing signal according to the magnetic field signal of the device under test 430 detected by the first sensing part, and generates a second magnetic field sensing signal according to the magnetic field signal of the device under test 430 detected by the second sensing part. The computation unit 422a performs a difference operation to the first magnetic field sensing signal and the second magnetic field sensing signal to generate a difference magnetic field sensing signal, and forms a difference magnetic field distribution according to the difference magnetic field sensing signals obtained at different horizontal positions.

In one embodiment, the magnetic field analysis unit 421a may be an instrument capable of digitizing the magnetic field signal, such as a vector network analyzer (VNA). The computation unit 422a may be an apparatus capable of performing operations according to digital signals and generating graphs, such as a computer. However, the present invention is not limited' in this regard.

In one embodiment, the difference operation is to substitute the first magnetic field sensing signal and the second magnetic field sensing signal obtained at a specific horizontal position along a horizontal axis (such as Y axis) into the following formula:

$$Sd = \frac{S1 - S2}{\sqrt{2}}$$

so as to obtain me difference magnetic field sensing signal. Where Sd denotes the difference magnetic field sensing signal at the specific horizontal position, S1 denotes the first magnetic field sensing signal at the specific horizontal position, and S2 denotes the second magnetic field sensing signal at the specific horizontal position.

In the present embodiment, the device under test 430 may be a microstrip line having a load of 50 ohms. The magnetic field probe 410 is positioned on X-Z plane. That is, a loop surface (not shown in the figure) of the probe head 411 is parallel with the X-Z plane. If it is defined that θ=0° when the magnetic field probe 410 faces Y axis and θ=90° when the magnetic field probe 410 faces X axis, signals obtained by the magnetic field analysis unit 421a (such as the vector network analyzer) when θ=0° and θ=90° are respectively the magnetic field signal and an electric field signal (assuming that the electrical field shielding is good) received by the magnetic field probe 410. Additionally, a ratio between electromagnetic fields is defined as electromagnetic field isolation. The greater the isolation value that a magnetic field probe has, the better its ability to isolate electric field noises. That is, the magnetic field probe will have a wider operating frequency and a higher spatial resolution.

When θ=0°, the magnetic field probe 410 moves horizontally relative to the device under test 430 (such as the microstrip line, that is to change a relative horizontal distance between the magnetic field probe 410 and the device under test 430). At this time, the measurement module 420*a* forms a first magnetic field distribution according to a variation of the magnetic field signal of the device under test 430 detected by the first sensing part along the horizontal axis, and forms a second magnetic field distribution according to a variation of the magnetic field signal of the device under test 430 detected by the second sensing part along the horizontal axis when the magnetic field probe 410 moves horizontally.

In other words, the first magnetic field distribution and the second magnetic field distribution along the horizontal direction are synchronously detected by the first sensing part and the second sensing part of the magnetic field probe 410. When a vertical distance between the magnetic field probe 410 and the device under test 430 is maintained the same, the first magnetic field distribution and the second magnetic field distribution correspond to a first vertical distance between the first sensing part and the device under test 430 and a second vertical distance between the second sensing part and the device under test 430, respectively.

Additionally, when the magnetic field probe 410 moves horizontally relative to the device under test 430, the measurement module 420*a* forms the difference magnetic field distribution according to the variation of the magnetic field signal of the device under test 430 detected by the first sensing part and the second sensing part along the horizontal axis when the magnetic field probe 410 moves horizontally.

Figure 4B:
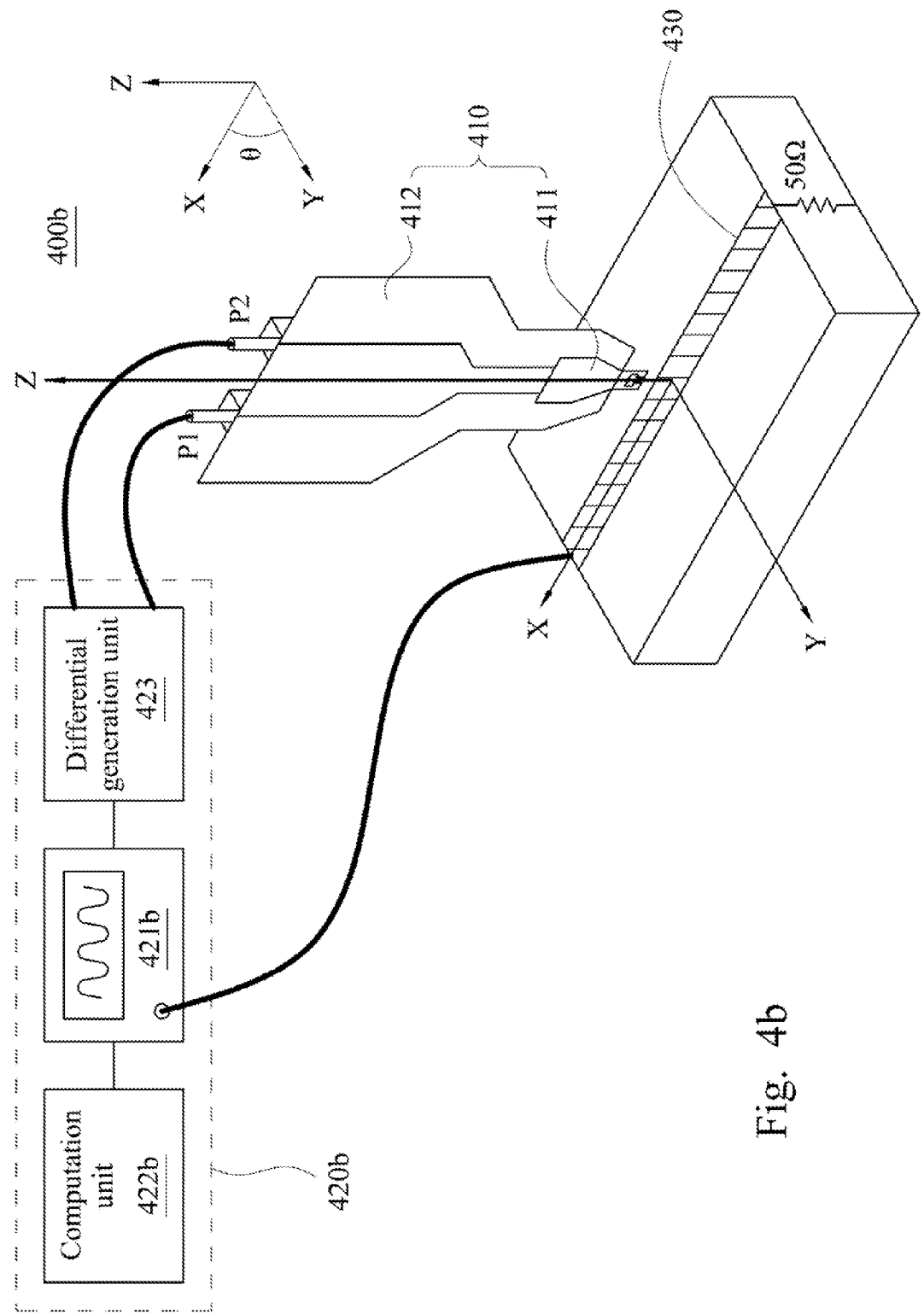
FIG. 4b is a schematic diagram illustrating a magnetic field measurement system according to a further embodiment of the present invention.

Reference is made to FIG. 4*b*. FIG. 4*b* is a schematic diagram illustrating a magnetic field measurement system 400*b* according to a further embodiment of the present invention. Similarly, the magnetic field measurement system 400*b* includes the magnetic field probe 410, a measurement module 420*b*, and the device under test 430. Since the connections between the magnetic field probe 410 and the device under test 430 and the operations are similar to the connections and operations described in the previous embodiments, a description in this regard is not provided.

In one embodiment, the measurement module 420*b* includes a magnetic field analysis unit 421*b*, a computation unit 422*b*, and a difference generation unit 423. The difference generation unit 423 is coupled between the magnetic field probe 410 and the magnetic field analysis unit 421*b*, and is configured for generating a difference magnetic field signal according to the magnetic field signal of the device under test 430 detected by the first sensing part and the second sensing part. The magnetic field analysis unit 421*b* may generate a difference magnetic field sensing signal according to the difference magnetic field signal. The computation unit 422*b* forms a difference magnetic field distribution according to the difference magnetic field sensing signals obtained at different horizontal positions.

Similarly, the magnetic field analysis unit 421*b* may be an instrument capable of digitizing the magnetic field signal, such as a vector network analyzer. The computation unit 422*b* may be an apparatus capable of performing operations according to digital signals and generating graphs, such as a computer. However, the present invention is not limited in this regard.

In one embodiment, the difference generation unit 423 may be a balanced-to-unbalanced (Balun) converter. A balanced-to-unbalanced converter is a three-terminal device. A first terminal and a second terminal (not shown in the figure) of the balanced-to-unbalanced converter are respectively coupled to the first output port P1 and the second output port P2 of the magnetic field probe 410. The balanced-to-unbalanced converter is configured for converting the magnetic field signal of the device under test 430 detected by the first sensing part and the second sensing part to the difference magnetic field signal, and outputting the difference magnetic field signal to the magnetic field analysis unit 421*b* through a third terminal (not shown in the figure) of the balanced-to-unbalanced converter. In this manner, the computation unit 422*b* can form the difference magnetic field distribution according to the difference magnetic field sensing signals obtained at different horizontal positions generated by the magnetic field analysis unit 421*b* without performing a difference operation to the first magnetic field sensing signal and the second magnetic field sensing signal generated by the magnetic field analysis unit 421*b*.

It is noted that, the difference generation unit 423 is disposed between the magnetic field probe 410 and the magnetic field analysis unit 421*b* according to the present embodiment. However, the difference generation unit 423 may be directly fabricated within the magnetic field probe 410, but the present invention is not limited in this regard.

Figure 5:
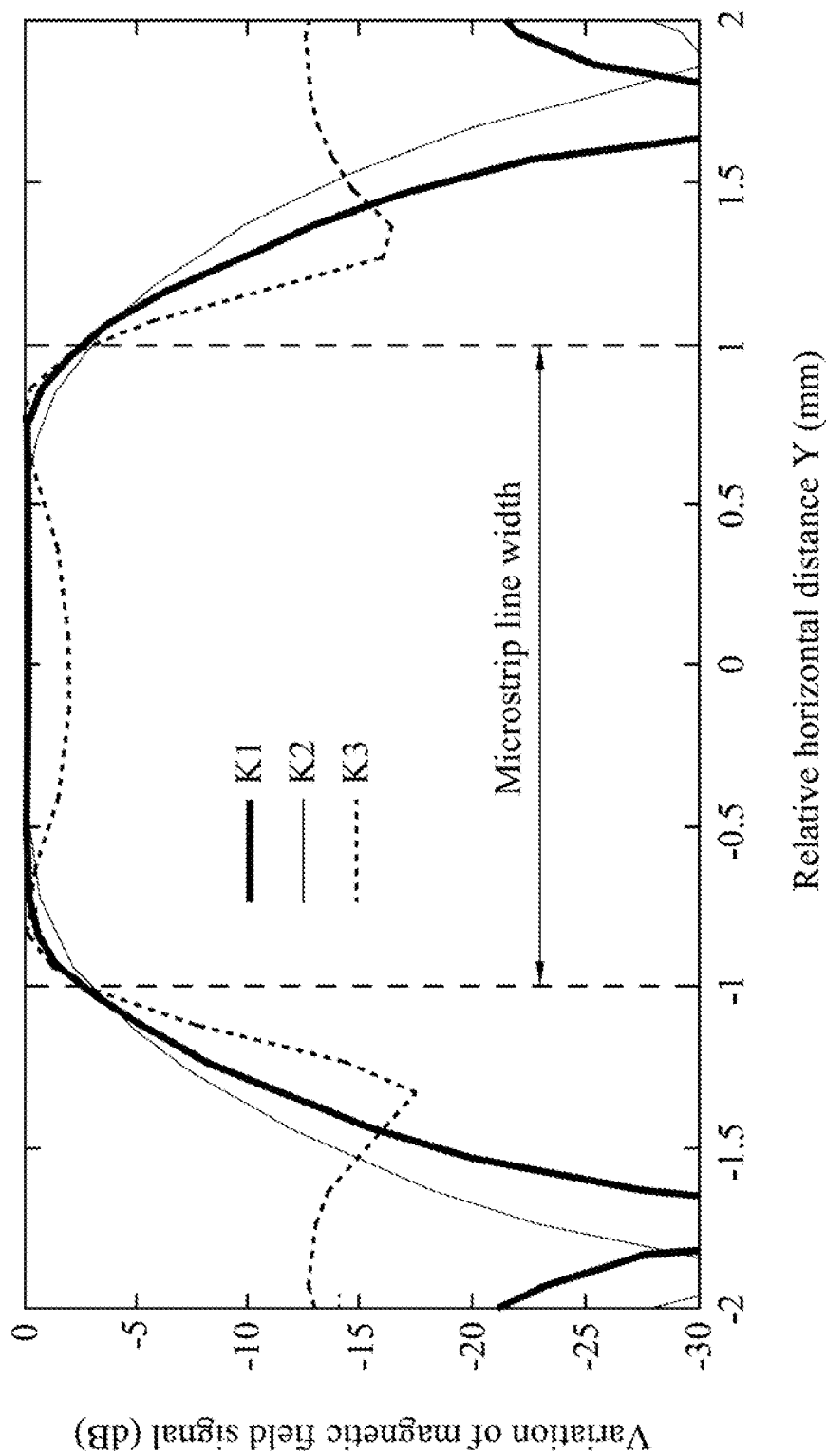
FIG. 5 illustrates a normalized magnetic field distribution diagram according to another embodiment of the present invention.

Reference is made to FIG. 4*a*, FIG. 4*b*, and FIG. 5. FIG. 5 illustrates a magnetic field distribution diagram according to another embodiment of the present invention. The horizontal axis represents the relative horizontal distance between the magnetic field probe 410 and the device under test 430, and the vertical axis represents the variation of the magnetic field signal of the device under test 430 detected by the magnetic field probe 410. Curve K1 represents the first magnetic field distribution, curve K2 represents the second magnetic field distribution, and curve K3 represents the difference magnetic field distribution. As shown in FIG. 5, although a width of the microstrip line (the device under test 430) in the present embodiment is larger than a width of the microstrip line (the device under test 130) shown in FIG. 2*b*, a spatial resolution of the difference magnetic field distribution (such as curve K3) is still superior to a spatial resolution of the first magnetic field distribution (such as curve K1) and a spatial resolution of the second magnetic field distribution (such as curve K2, that is, curve K3 is narrower in comparison with curve K1 and curv3 K2).

Figure 6:
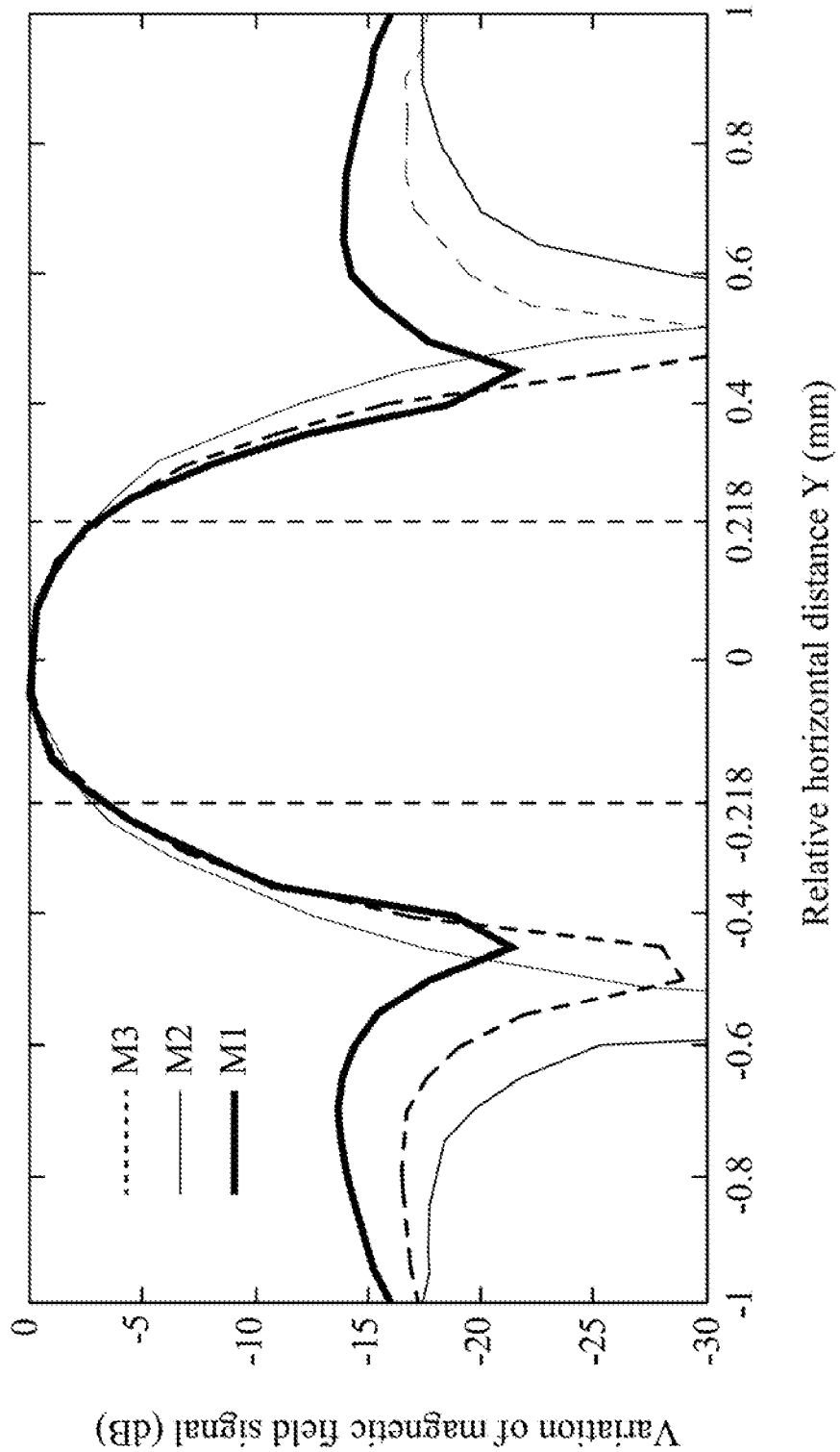
FIG. 6 illustrates a magnetic field distribution diagram according to a further embodiment of the present invention.

Reference is made to FIG. 6. FIG. 6 illustrates a magnetic field distribution diagram according to a further embodiment of the present invention. Curve M1 represents a difference magnetic field distribution formed by a magnetic field probe according to one embodiment of the present invention. Curve M2 represents a magnetic field distribution formed by a traditional dual-load symmetrical magnetic field probe (a gap height of loop is 100 μm). Curve M3 represents a magnetic field distribution formed by a traditional dual-load symmetrical magnetic field probe (a gap height of loop is 10 μm). The magnetic field probe according to the one embodiment of the present invention and the traditional dual-load symmetrical magnetic field probes are fabricated by the same process and have the same loop width.

As shown in FIG. 6, a distribution of curve M3 is approximately the same as a distribution of curve M1. That is, a spatial resolution of curve M3 is approximately the same as a spatial resolution of curve M1. However, curve M3 represents the distribution formed by the traditional dual-load symmetrical magnetic field probe having the gap height of 10 μm. Furthermore, only when the gap height of the traditional dual-load symmetrical magnetic field probe is reduced to 10 μm can the spatial resolution of the traditional dual-load symmetrical magnetic field probe be the same as the spatial resolution of the magnetic field probe according to the present invention. However, a too small loop gap will reduce the sensitivity of the magnetic field probe. In other words, the magnetic field probe according to the present invention has a higher sensitivity than the traditional dual-load symmetrical magnetic field probe (the gap height of loop is 10 μm) when both of them have the same spatial resolution.

Figure 7:
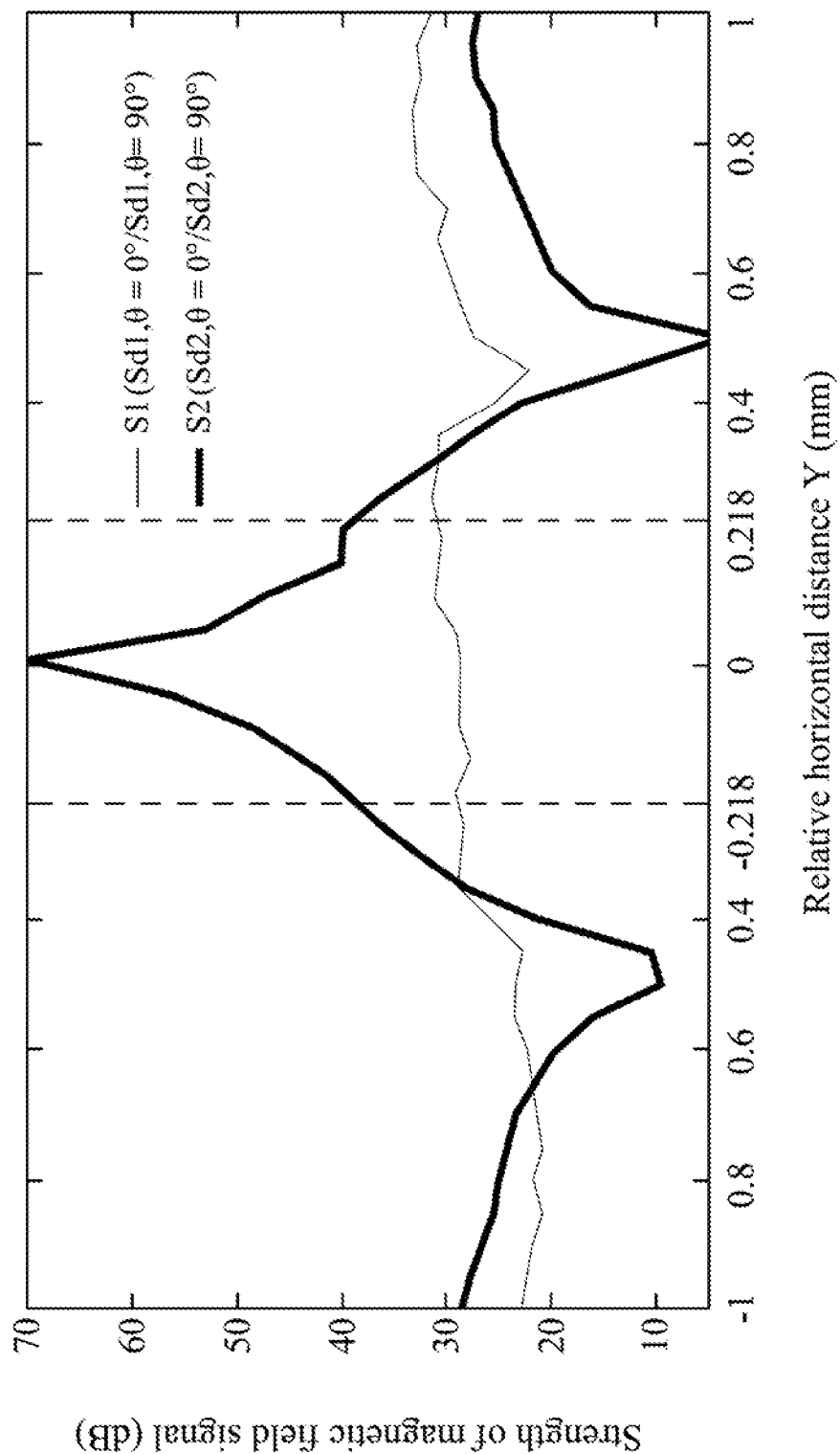
FIG. 7 illustrates an electric field suppression diagram when measuring a long straight microstrip line according to one embodiment of the present invention.

Additionally, the magnetic field probe according to the present invention has a better electric field isolation when compared with the traditional dual-load symmetrical magnetic field probe (that is the extent to which the magnetic field probe is not interfered with by the electric field when detecting the magnetic field signal). Reference is made to FIG. 7. FIG. 7 illustrates an electric field suppression diagram when measuring a long straight microstrip line according to one embodiment of the present invention. Curve S1 represents a ratio of a magnetic field signal strength Sd1 of the difference magnetic field probe according to the present invention when θ=0° to a electric field signal strength Sd1 of the difference magnetic field probe according to the present invention when θ=90° (Sd1, θ=0°/Sd1=90° that is the electric field isolation). Curve S2 represents a ratio of a magnetic field signal strength Sd2 of the traditional dual-load symmetrical magnetic field probe (the gap height of loop is 10 μm) when θ=0° to a electric field signal strength Sd2 of the traditional dual-load symmetrical magnetic field probe when θ=90° (Sd2, θ0°/Sd2, θ=90°). As shown in FIG. 7, curve S1 indicates steady electric field suppression (curve S1 has smaller up and downs than curve S2). In other words, the magnetic field probe according to the present invention has steadier electric field suppression ability when applied in various measurement environments so as to accurately detect the magnetic field signal of the device under test.

According to the above-mentioned embodiments of the present invention, it is apparent that the present invention magnetic field probe has a better spatial resolution. In addition, since it is not necessary to shrink the size of the loop gap, the present invention magnetic field probe maintains a good sensitivity. The present invention magnetic field probe also has good suppression ability for asymmetric coupled electric field, and the resolution of the present invention magnetic field probe is less sensitive to its distance to the device under test (that is, the resolution of the difference magnetic field probe is not susceptible to the influence of the surface roughness of the device under test). In addition to that, the magnetic field probe has a low cost and is strong and durable because it is fabricated by a low temperature co-fired ceramic process.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents,

What is claimed is:

1. A magnetic field probe, comprising:
   a probe head, comprising:
      a first inner metal layer, comprising a first sensing part and a first connection part coupled to the first sensing part, the first sensing part being configured for detecting a magnetic field signal of a device under test so as to form a first magnetic field distribution; and
      a second inner metal layer, comprising a second sensing part and a second connection part coupled to the second sensing part, the second sensing part being configured for detecting the magnetic field signal of the device under test so as to form a second magnetic field distribution;
      wherein a distance between the first sensing part and the device under test is smaller than a distance between the second sensing part and the device under test,
      wherein the first sensing part comprises a single loop, the second sensing part comprises dual loops, the single loop of the first sensing part is disposed between the dual loops of the second sensing part.

2. The magnetic field probe of claim 1, wherein the probe head comprises a first shielding layer and a second shielding layer, the first inner metal layer and the second inner metal layer are disposed between the first shielding layer and the second shielding layer.

3. The magnetic field probe of claim 1, wherein the probe head comprises a first shielding layer and a second shielding layer, the first inner metal layer and the second inner metal layer are disposed between the first shielding layer and the second shielding layer.

4. The magnetic field probe of claim 2, wherein an opening is formed in each of the first shielding layer and the second shielding layer, the openings are respectively located at positions where orthogonal projections of the first sensing part on the first shielding layer and the second sensing part on the second shielding layer are located.

5. The magnetic field probe of claim 1, further comprising a probe body, the probe body comprising a first stripline and a second stripline, the first stripline and the second stripline being respectively coupled to the first connection part and the second connection part, the first stripline and the second stripline being respectively configured for outputting the magnetic field signal of the device under test detected by the first sensing part and the magnetic field signal of the device under test detected by the second sensing part.

6. The magnetic field probe of claim 1, further comprising a probe body, the probe body comprising a first stripline and a second stripline, the first stripline and the second stripline being respectively coupled to the first connection part and the second connection part, the first stripline and the second stripline being respectively configured for outputting the magnetic field signal of the device under test detected by the first sensing part and the magnetic field signal of the device under test detected by the second sensing part.

7. The magnetic field probe of claim 1, wherein the magnetic field probe is fabricated in a low temperature co-fired ceramic (LTCC) process.

8. A magnetic field measurement system, comprising:
   the magnetic field probe as claimed in claim 1 for detecting a magnetic field signal of a device under test, a first vertical distance between the first sensing part and the device under test being smaller than a second vertical distance between the second sensing part and the device under test; and
   a measurement module, configured for obtaining a difference magnetic field distribution according to the magnetic field signal of the device under test detected by the first sensing part and the second sensing part.

9. The magnetic field measurement system of claim 8, wherein the measurement module comprises:

a difference generation unit, coupled to the magnetic field probe and configured for generating a difference magnetic field signal according to the magnetic field signal of the device under test detected by the first sensing part and the second sensing part;

a magnetic field analysis unit, coupled to the difference generation unit and configured for generating a difference magnetic field sensing signal according to the difference magnetic field signal; and a computation unit, configured for forming the difference magnetic field distribution according to the difference magnetic field sensing signal.

10. The magnetic field measurement system of claim 8, wherein the measurement module comprises:

a magnetic field analysis unit, configured for generating a first magnetic field sensing signal according to the magnetic field signal of the device under test detected by the first sensing part, and generating a second magnetic field sensing signal according to the magnetic field signal of the device under test detected by the second sensing part; and a computation unit, configured for performing a difference operation to the first magnetic field sensing signal and the second magnetic field sensing signal to generate a difference magnetic field sensing signal, and forming the difference magnetic field distribution according to the difference magnetic field sensing signal.

11. The magnetic field measurement system of claim 10, wherein the difference operation is to substitute the first magnetic field sensing signal and the second magnetic field sensing signal obtained at a specific horizontal position along a horizontal axis into the following formula:

$$Sd = \frac{S1 - S2}{\sqrt{2}}$$

so as to obtain the difference magnetic field sensing signal, where Sd denotes the difference magnetic field sensing signal at the specific horizontal position, S1 denotes the first magnetic field sensing signal at the specific horizontal position, and S2 denotes the second magnetic field sensing signal at the specific horizontal position.

12. The magnetic field measurement system of claim 8, wherein the magnetic field probe moves horizontally relative to the device under test, the measurement module forms the difference magnetic field distribution according to a variation of the magnetic field signal of the device under test detected by the first sensing part and the second sensing part along the horizontal axis when the magnetic field probe moves horizontally.

13. The magnetic field measurement system of claim 12, wherein the measurement module forms a first magnetic field distribution according to the variation of the magnetic field signal of the device under test detected by the first sensing part along the horizontal axis when the magnetic field probe moves horizontally, and forms a second magnetic field distribution according to the variation of the magnetic field signal of the device under test detected by the second sensing part along the horizontal axis when the magnetic field probe moves horizontally.

14. The magnetic field measurement system of claim 13, wherein the first magnetic field distribution and the second magnetic field distribution along a horizontal direction are synchronously detected, and the first magnetic field distribution and the second magnetic field distribution along a vertical direction respectively correspond to the first vertical distance and the second vertical distance.

15. The magnetic field measurement system of claim 8, wherein the first sensing part has a single loop, the second sensing part has dual loops, the single loop of the first sensing part is disposed between the dual loops of the second sensing part.

16. A magnetic field measurement method, comprising:

detecting a magnetic field signal of a device under test by the first sensing part and the second sensing part of the magnetic field probe as claimed in claim 1, a first vertical distance between the first sensing part and the device under test being smaller than a second vertical distance between the second sensing part and the device under test;

moving the magnetic field probe so that the magnetic field probe moves horizontally relative to the device under test; and forming a difference magnetic field distribution according to a variation of the magnetic field signal of the device under test detected by the first sensing part and the second sensing part along a horizontal axis when the magnetic field probe moves horizontally.

17. The magnetic field measurement method of claim 16, further comprising:

forming a first magnetic field distribution according to the variation of the magnetic field signal of the device under test detected by the first sensing part along the horizontal axis when the magnetic field probe moves horizontally; and forming a second magnetic field distribution according to the variation of the magnetic field signal of the device under test detected by the second sensing part along the horizontal axis when the magnetic field probe moves horizontally.

18. The magnetic field measurement method of claim 16, wherein the first magnetic field distribution and the second magnetic field distribution along a horizontal direction are synchronously detected, and the first magnetic field distribution and the second magnetic field distribution along a vertical direction respectively correspond to the first vertical distance and the second vertical distance.

* * * * *